US012693366B2

(12) United States Patent
Loehner et al.

(10) Patent No.: US 12,693,366 B2
(45) Date of Patent: Jul. 28, 2026

(54) TEST POINT VOLTAGE SENSOR

(71) Applicant: Schweitzer Engineering Laboratories, Inc., Pullman, WA (US)

(72) Inventors: Henry Loehner, Spokane Valley, WA (US); Naiden K. Spasov, Spokane Valley, WA (US); Stephen F. Witt, Skokie, IL (US); Miralem Cosic, Spokane, WA (US); Jeff Bassett, Elgin, IL (US); Anatoliy V. Kozlov, Spokane, WA (US); Kenneth J. Van Den Heuvel, Newman Lake, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 361 days.

(21) Appl. No.: 18/500,428

(22) Filed: Nov. 2, 2023

(65) Prior Publication Data

US 2024/0295622 A1 Sep. 5, 2024

Related U.S. Application Data

(60) Provisional application No. 63/487,924, filed on Mar. 2, 2023.

(51) Int. Cl.
*G01R 35/00* (2006.01)
*G01R 15/16* (2006.01)
*G01R 19/165* (2006.01)

(52) U.S. Cl.
CPC ........... *G01R 35/005* (2013.01); *G01R 15/16* (2013.01); *G01R 19/16576* (2013.01)

(58) Field of Classification Search
CPC ......................... G01R 15/16; G01R 19/16576; G01R 35/005; G01R 1/00; G01R 3/00; G01R 5/00; G01R 7/00; G01R 9/00; G01R 11/00; G01R 13/00; G01R 15/00; G01R 17/00; G01R 19/00; G01R 21/00; G01R 22/00; G01R 23/00; G01R 25/00; G01R 27/00; G01R 29/00; G01R 31/00; G01R 33/00; G01R 35/00
See application file for complete search history.

(56) References Cited

U.S. PATENT DOCUMENTS

| | | | |
|---|---|---|---|
| 4,251,770 A | 2/1981 | Schweitzer, Jr. | |
| 5,077,520 A * | 12/1991 | Schweitzer, Jr. ...... | G01R 15/16 324/133 |
| 2005/0077906 A1* | 4/2005 | Baumgartner ..... | G01R 31/2884 324/522 |

* cited by examiner

*Primary Examiner* — Neel D Shah
*Assistant Examiner* — Brent J Andrews
(74) *Attorney, Agent, or Firm* — Jared L. Cherry

(57) ABSTRACT

A system for monitoring a voltage of a conductor of an electric power delivery system after automatic voltage sensor calibration. The system includes a sensor for capacitive coupling with an access point. The system includes an IED in electrical communication with the sensor to obtain signals therefrom. The IED may be configured to automatically calibrate to accommodate the signals from the conductor obtained using the sensor. The IED may provide an output depending on the determined voltage on the conductor.

20 Claims, 5 Drawing Sheets

TEST POINT VOLTAGE SENSOR

RELATED APPLICATIONS

This application claims priority to U.S. Provisional Application Ser. No. 63/487,924, filed on Mar. 2, 2023, entitled "TEST POINT VOLTAGE SENSOR," which is hereby incorporated by reference in its entirety for all purposes.

TECHNICAL FIELD

This disclosure relates to test point voltage sensors for use in electric power delivery systems. More particularly, this disclosure relates to automatically calibrating test point voltage sensors that may be used to monitor electric power delivery system equipment.

BRIEF DESCRIPTION OF THE DRAWINGS

Non-limiting and non-exhaustive embodiments of the disclosure are described, including various embodiments of the disclosure with reference to the figures, in which.

Figure 1:
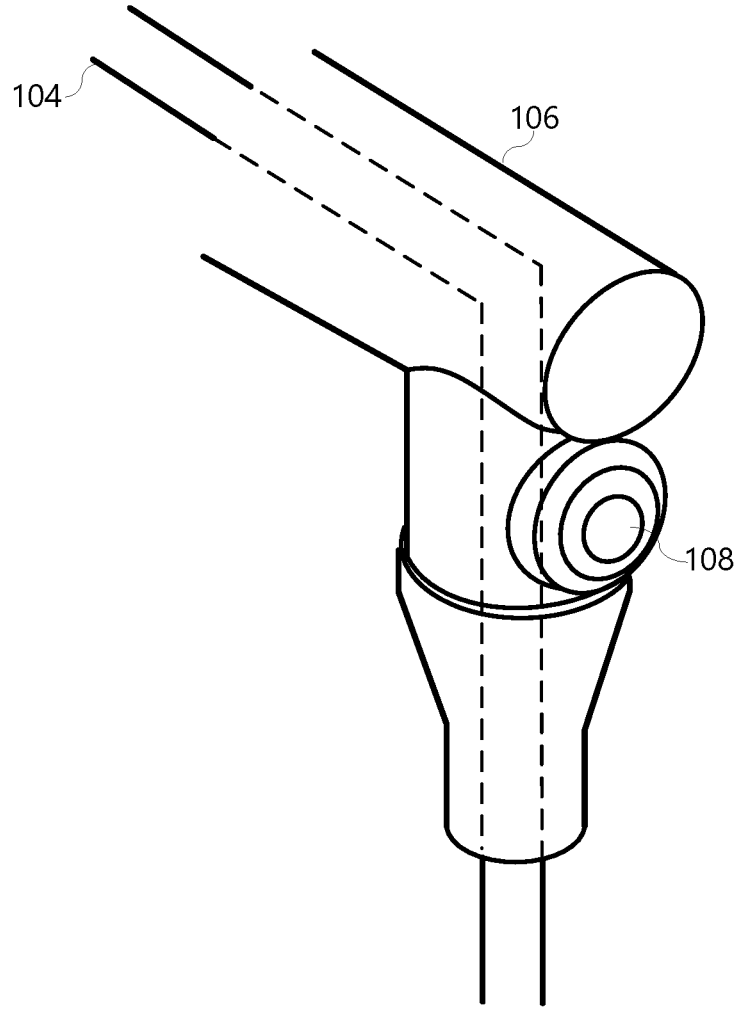
FIG. 1 illustrates a test point of a single phase of an electric power delivery system consistent with embodiments of the present disclosure.

In the following description, numerous specific details are provided for a thorough understanding of the various embodiments disclosed herein. However, those skilled in the art will recognize that the systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Electric power delivery systems require an abundance of equipment for the safe and reliable delivery of electric power from generation to load. Portions of an electric power delivery system may include conductors with nodes that are made available for obtaining electrical power system measurements, testing, and/or determining if a conductor is energized. Shielded conduits for conductors may be made physically available for such purposes, and may include signal access nodes such as test points (TPs) or basic insulating plugs (BIPs) that provide a limited energy signal that could be transformed into a scaled fraction of a line voltage of the conductor within the shielding. Signal access nodes may include a point in electrical communication with the conductor via a capacitive coupling.

This disclosure provides an economical and reliable method of detecting power loss. More particularly, but not exclusively, the present disclosure may be applied to detecting power loss in underground medium voltage power distribution systems. Customer applications include but are not limited to power loss indication and implementation of power source switching schemes.

Existing voltage sensors utilize capacitive voltage dividers to sense power system voltage. Devices using this approach are vulnerable to electromagnetic interference (EMI), parasitic capacitances in quick disconnect elbows, and overvoltage protection in sensors and sensor cables. These factors negatively impact the sensor's measurement accuracy.

Additionally, there is a large variety of elbow manufacturers, each of which offers elbows with different voltage ratings and inconsistent electrical parameters among manufacturing lots of the same elbow model. Elbows may have TPs or BIPs as connection points for voltage sensors. All of these factors result in a wide range of voltage signals fed into voltage sensors.

Existing voltage sensors have been designed and factory calibrated for a specific elbow brand, voltage rating, and type of contact point. This requires manufacturers and customers to maintain a large number of voltage sensor models creating complexities in sensor ordering, manufacturing, and installation processes. Despite the factory calibration to customer-specified voltage rating and elbow type, voltage sensors are still vulnerable to inconsistencies among manufacturing lots of the same model, leading to customer dissatisfaction.

FIG. 1 illustrates a test point of a single phase of an electric power delivery system consistent with embodiments of the present disclosure. The cable includes a conductor 104 within a shielding 106. As such cables are often located underground or at street level, the conductors are typically heavily shielded. A shielding 106 may include an elbow with an access node 108. The access node may be in the form of a TP or a BIP. Sensors consistent with the present disclosure may mount to either a TP or a BIP, which may provide a point for obtaining electrical signals related to the power flowing through conductor 104.

Access node 108 may be in electrical communication with conductor 104 using a capacitive voltage divider. The capacitive voltage divider may reduce the voltage of access node 108 to approximately 10% to 12% of the voltage of conductor 104. As one of skill in the art may appreciate, a three-phase system may be monitored using similar techniques.

Figure 2:
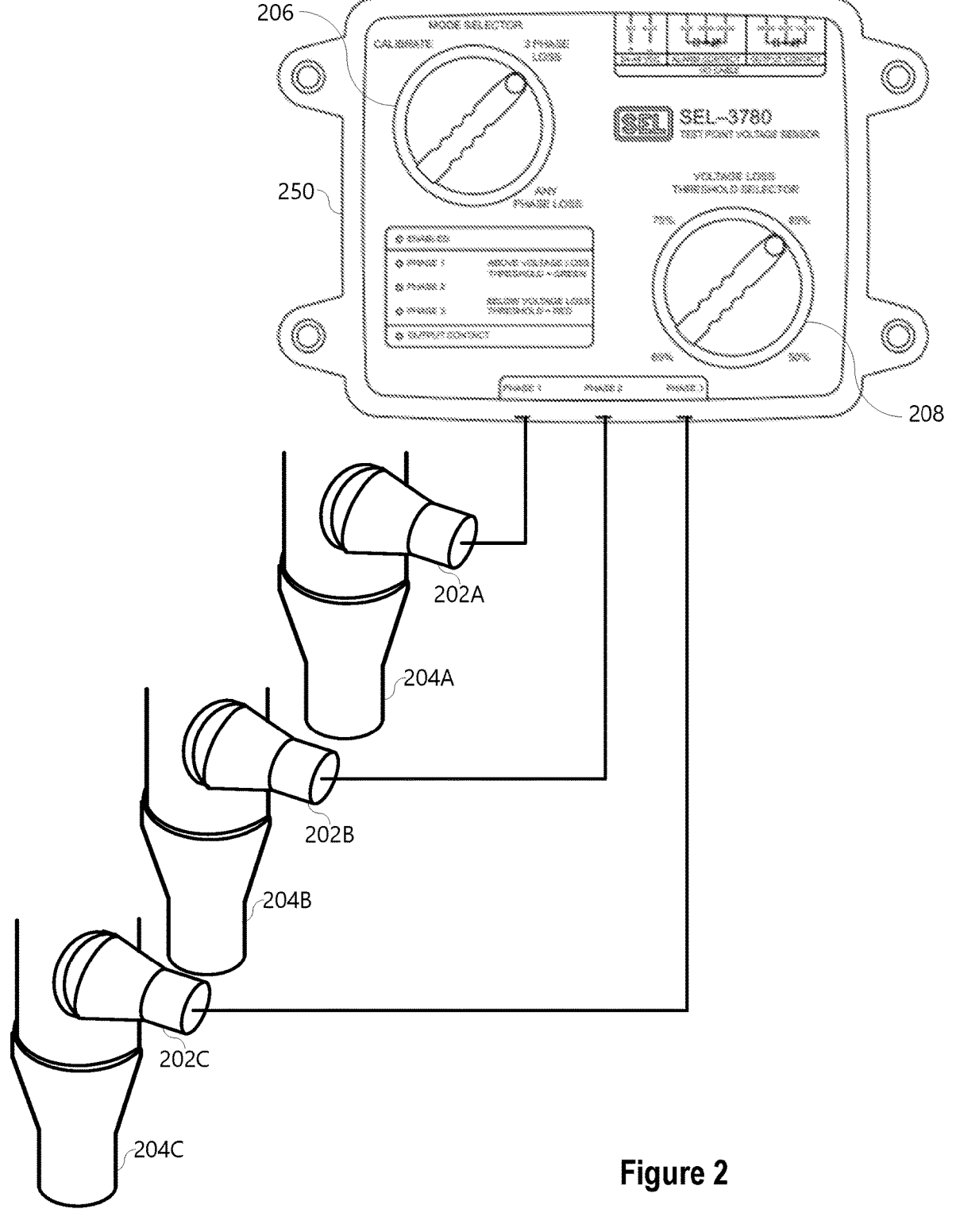
FIG. 2 illustrates a test point voltage sensor system for use with multiple phases of an electric power delivery system consistent with embodiments of the present disclosure.

FIG. 2 illustrates a test point voltage sensor system in communication with phase conductors 204A-C in an electric power system consistent with embodiments of the present disclosure. The three phase conductors 204A-C each include access points that are coupled with an instrument transformer 202A-C, respectively. Electrical signals travel from the instrument transformers 202A-C to an intelligent electronic device (IED) 250. IED 250 may obtain electrical signals proportional to the power flowing through phase conductors 204A-C via the instrument transformers 202A-C. As described in more detail herein, the system may be configured to automatically calibrate for each phase conductor 204A-C.

In general, replacing a capacitive voltage divider in the voltage sensor input with a trans-impedance amplifier improves the immunity to EMI, parasitic capacitances in quick disconnect elbows, and overvoltage protection in sensors and sensor cables.

In the illustrated embodiment, IED 250 includes a mode selector 206. One mode allows a user to calibrate access nodes. As described in greater detail below, IED 250 may perform the calibration automatically and without user intervention. Once instrument transformers 202A-C are calibrated, mode selector 206 may be put into an operating mode (e.g., a "3-phase loss" detection mode or an "any phase loss" detection mode). A voltage loss threshold selector 208 may establish a threshold at which IED 250 indicates a voltage loss. Automatic calibration and the ability to set a voltage loss threshold using voltage loss threshold selector 208 may reduce the burden of configuring IED 250. A user-selectable voltage loss threshold may facilitate use of IED 250 in various applications and conditions.

Figure 3:
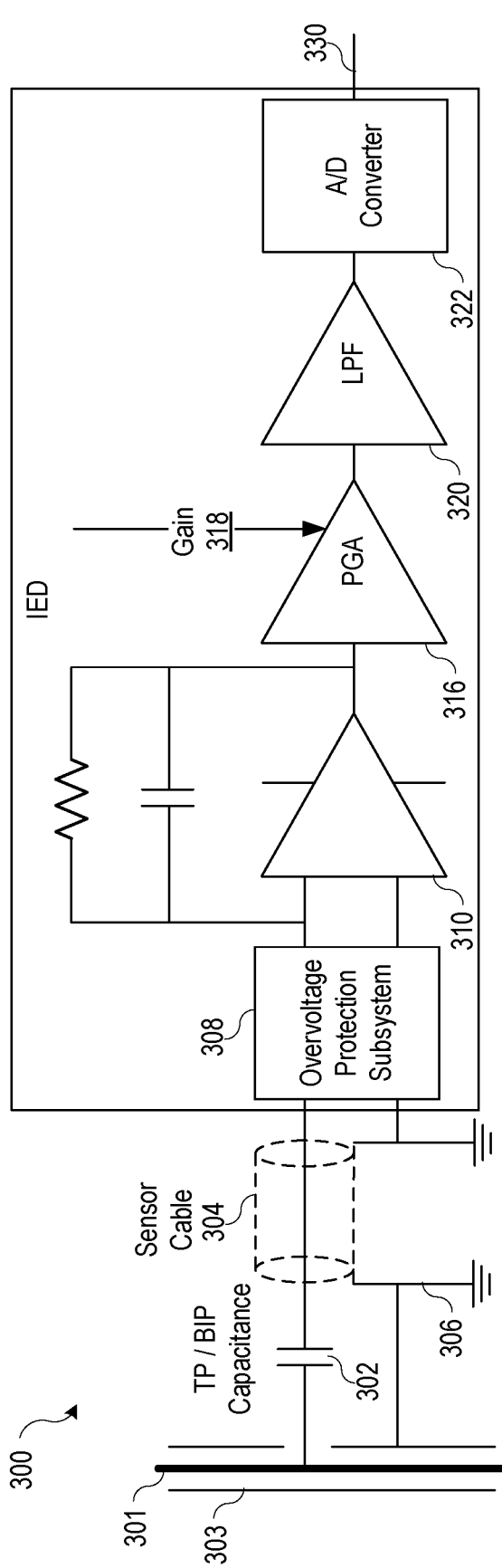
FIG. 3 illustrates a simplified diagram of a system for obtaining electrical signals from a conductor via an access point in accordance with embodiments consistent with the present disclosure.

FIG. 3 illustrates a simplified diagram of a system 300 for obtaining electrical signals from a conductor 301 via an access point in accordance with embodiments consistent with the present disclosure. A sensor may be capacitively coupled to conductor 301 and provide signals therefrom via a sensor cable 304 that is grounded to the same ground 306 as a cable shield 303. An overvoltage protection subsystem 308 may be provided to protect components of an IED. Conductor 301 and TP/BIP capacitance 302 form a current source that drives current into a trans-impedance amplifier input 310.

During an automated calibration process, an input to trans-impedance amplifier input 310 may be driven to 0V and may act as a short circuit for the input signal. Thus, all parasitic capacitances are bypassed by this short circuit input and do not have impact on measurement accuracy.

The equivalent input current is given by Eq. 1, and is proportional to power system frequency (f), TP/BIP capacitance ($C_{TP/BIP}$), and power conductor voltage ($v_{cond}$):

$$i = 2\pi f C_{TP/BIP} v_{cond} \qquad \text{Eq. 1}$$

Power system frequency changes within relatively tight limits and TP/BIP capacitance 302 can only slowly change as it is temperature dependent. Therefore, monitoring the input current for rapid changes is an adequate method for detecting rapid changes in the power conductor voltage.

The TP/BIP capacitance 302 acts as a differentiator to higher order harmonics in the power conductor voltage resulting in distortion in sensor input signal and reduced measurement accuracy. To negate the effect of this differentiator, the trans-impedance amplifier 310 is configured as an integrator.

The sensor input current can vary within a wide range due to the range of:

TP/BIP capacitance ($C_{TP/BIP}$)
Power system frequency (f)
Power system voltage ($v_{cond}$)

Compounding these three ranges in equation (1) produces a such wide range for sensor input current that a measurement circuit with fixed gain cannot provide sufficient measurement resolution for input currents at the low end of power voltage and TP/BIP capacitance ranges. To solve this problem a Programmable Gain Amplifier (PGA) 316 may scale the integrator output to the input range of A/D converter 322. An amplifier gain 318 is set after sensor deployment in a customer application by executing a field calibration. Thus, one single voltage sensor configuration is offered to all customers for all voltage sensing applications. A Low Pass Filter (LPF) 320 removes high frequency noise from an A/D input signal. The A/D converter 322 provides a digitized signal 330 relative to the power in conductor 301.

Figure 4:
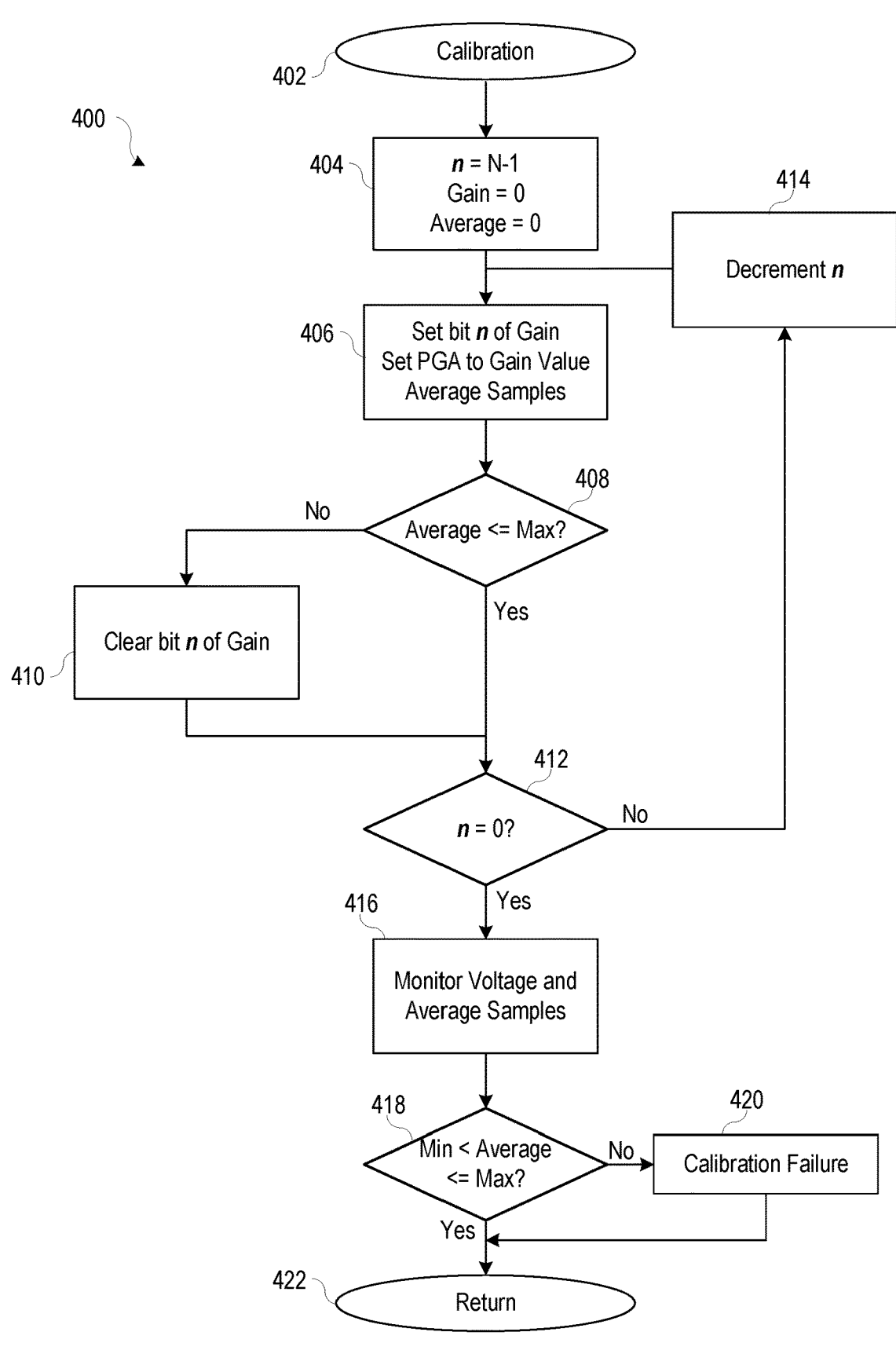
FIG. 4 illustrates a flowchart of a method for calibration of an IED configured to obtain electrical signals from an access point in accordance with embodiments of the present disclosure.

FIG. 4 illustrates a flowchart of a method 400 for calibration of an IED configured to obtain electrical signals from an access point in accordance with embodiments of the present disclosure. A device calibration 402 may be performed on energized conductors after device installation. Method 400 uses successive approximation (steps 404, 406, 408, 410, 412, 414) to determine an optimal gain (G) in a minimum number of iterations.

At 404, values may be initialized. In the illustrated embodiment, a specified number of iterations may be controlled using a counter value. A gain value may initially be set to 0, and the gain may be increased over successive iterations. In other embodiments, a variety of strategies may be utilized to identify an appropriate gain value. For example, one embodiment may analyze all gain settings; however, this method is the least efficient. Another alternative is using a binary search method. Finally, an average voltage value may be initialized to 0.

At 406, a gain value may be increased, and the PGA may be set to the gain value. A set of samples may be obtained and averaged. At 408, the average of the set of samples may be compared to a maximum threshold. The optimal gain results in the average being close to but not exceeding the maximum threshold. In some embodiments, the average also must be greater than or equal to a minimum threshold. The minimum threshold is a such value that allows the voltage sensor track sensors readings 50% below calibration level with 1% maximum measurement error. In one specific embodiment, the maximum threshold is approximately two-thirds of the A/D maximum input voltage. Thus, the voltage sensor can track test point signals 50% higher from the field calibration level. If the average is less than the maximum threshold, method 400 may proceed to 412. Otherwise, the gain value may be reduced at 410. Method 400 may continue until the counter reaches 0. If the counter value is not equal to 0 at 412, the value may be decremented at 414, and another iteration may begin.

Once the gain has been determined using the iterative process, each bit value has been determined, and X is equal to 0, several additional samples may be averaged at 416 using the determined gain, and the average value stored as the calibrated set point. If the average value is between the minimum and maximum values at 418, method 400 may return at 422. If the average value is not between the minimum and maximum values at 418, the calibration may fail at 420. A user may be notified of a calibration failure.

Figure 5A:
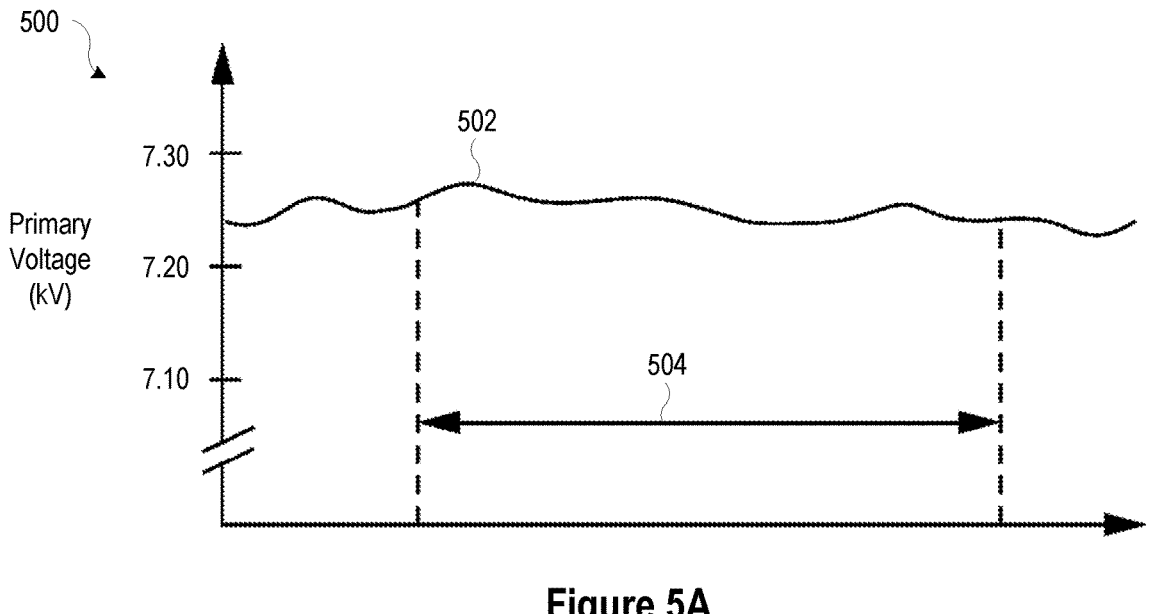
FIG. 5A illustrates a plot over a first period of time of a system voltage consistent with embodiments of the present disclosure.

FIG. 5A illustrates a plot 500 over a first period of time of a system voltage 502 consistent with embodiments of the present disclosure. An average system voltage value may be determined over a period of time 504. In various embodiments, the system voltage 502 may be 30 seconds or less. During period 504, the average system voltage 502 is 7.24 kV. This value may be the calibration set point and may be compared to measured values to determine a loss of voltage. Various thresholds (e.g., 50%, 60%, 75%, 85%) may be used for purposes of determining whether one or more phases have lost power.

Figure 5B:
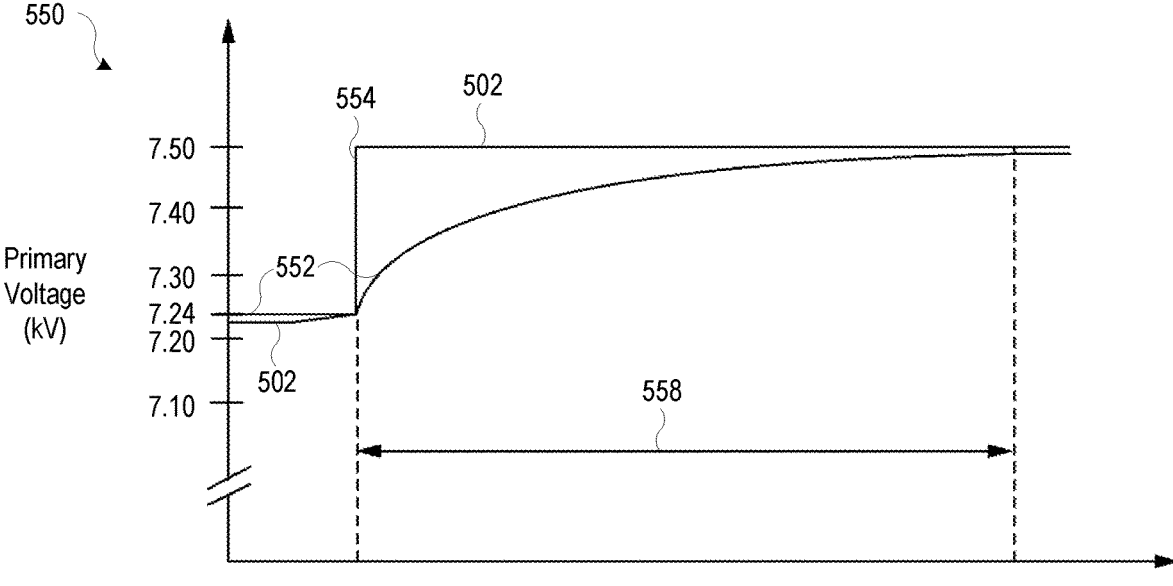
FIG. 5B illustrates a plot over a second period of time of the system voltage, and during which the system voltage changes consistent with embodiments of the present disclosure.

FIG. 5B illustrates a plot 550 over a second period of time of the system voltage 502, and during which the system voltage 502 changes consistent with embodiments of the present disclosure. As illustrated, the system voltage 502 begins to increase at the start of the second period of time 558, and jumps significantly at time 554. Primary system voltage can vary throughout the day, month, or year because of loading, switching, capacitor bank connection, voltage regulator operation, etc. Thus, the average voltage 552 (initially determined as 7.24 kV from the calibration procedure illustrated in FIG. 5A) may be adjusted over time so that an accurate voltage loss threshold is available.

In the illustrated embodiment, the voltage calculation is averaged over time. Averaging the voltage over time effectively filters out transient voltage changes; however, where there is a sustained change in voltage, the average voltage 552 increases over the second period of time 558. In the illustrated embodiment, period 558 may be approximately 15 minutes. The duration of period 558 may be specified by an operator.

Accordingly, the present disclosure provides an improvement in sensor calibration. Where previous solutions required accurate TP/BIP capacitance information (and such physical devices are somewhat inconsistent), the present solutions automatically calibrate sensors without accurate TP/BIP capacitance information.

Sensors in accordance with the various embodiments herein may be used to determine a voltage on the cable. The voltage may be used to determine a loss of voltage. The systems herein may provide further protection, automation, or communication upon detection of a loss of voltage. For example, upon detecting a loss of voltage of a particular conductor of a phase, the system may signal a follow-on device to initiate a power transfer.

What is claimed:

1. A system to calibrate a sensor in electric power delivery system monitoring, the system comprising:
   a sensor configured to capacitively couple to an access point of a conductor of the electric power delivery system and configured to generate a signal representative of a voltage of the conductor; and
   an intelligent electronic device (IED) in electrical communication with the sensor and configured to receive the signal from the sensor, the IED comprising:
      an integrating amplifier in electrical communication with the sensor;
      a programmable gain amplifier (PGA) in electrical communication with the integrating amplifier and configured to amplify the signal representative of the voltage of the conductor based on a programmable gain;
      an A/D converter in electrical communication with the PGA and configured to receive the signal of the representative of the voltage of the conductor and to produce a digitized representation thereof; and
      a programmable processing device including instructions that when processed cause the IED to:
         set the programmable gain to a preliminary value;
         average a plurality of samples from the A/D converter;
         compare the average with a maximum threshold;
         set the programmable gain to a new value depending on the comparison; and
         monitor the sensor to determine a loss of voltage using the new value of the programmable gain.

2. The system of claim 1, wherein calibration of the sensor is completed without a measure of a capacitive coupling value of the sensor to the conductor of the electric power system.

3. The system of claim 1, wherein calibration of the sensor is completed without user intervention.

4. The system of claim 1, wherein the programmable processing device further includes instructions that when processed cause the device to determine the loss of voltage based on a user-selected threshold.

5. The system of claim 4, wherein the programmable processing device further includes instructions that when processed cause the IED to:
   determine an initial average system voltage, and
   determine a loss of voltage when the voltage of the conductor falls below a value determined by the initial average system voltage and the user-selected threshold.

6. The system of claim 5, wherein the programmable processing device further includes instructions that when processed cause the IED to update the average system voltage during operation of the IED.

7. The system of claim 1, wherein the sensor is configured to monitor an underground medium voltage distribution system.

8. The system of claim 1, wherein the sensor is configured to mount to one of a test Point (TP) and basic insulating plug (BIP).

9. The system of claim 1, further comprising a Low Pass Filter (LPF) in electrical communication with an output of the PGA and an input of the A/D converter, and configured to filter high frequency components from the signal representative of the voltage of the conductor.

10. The system of claim 1, wherein the programmable processing device further includes instructions that when processed cause the IED to compare the average with a minimum threshold.

11. A method of calibrating a sensor in electric power delivery system monitoring, the method comprising:
   generating, using a sensor capacitively coupled to an access point of a conductor of the electric power delivery system, a signal representative of a voltage of the conductor;
   receiving, using an intelligent electronic device (IED) in electrical communication with the sensor, the signal representative of the voltage of the conductor from the sensor;
   amplifying, using an integrating amplifier in electrical communication with the sensor, the signal;
   amplifying, using a programmable gain amplifier (PGA) in electrical communication with the integrating amplifier, the signal representative of the voltage of the conductor based on a programmable gain;
   producing, using an A/D converter in electrical communication with the PGA, a digitized representation of the signal representative of the voltage of the conductor;
   setting, using a programmable processing device of the IED, the programmable gain to a preliminary value;
   averaging, using the programmable processing device of the IED, a plurality of samples from the A/D converter;
   comparing, using the programmable processing device of the IED, the average with a maximum threshold;
   setting, using the programmable processing device of the IED, the programmable gain to a new value depending on the comparison; and
   monitoring, using the programmable processing device of the IED, the sensor to determine a loss of voltage using the new value of the programmable gain.

12. The method of claim 11, wherein calibration of the sensor is completed without a measure of a capacitive coupling value of the sensor to the conductor of the electric power system.

13. The method of claim 11, wherein calibration of the sensor is completed without user intervention.

14. The method of claim 11, wherein the programmable processing device further includes instructions that when processed cause the IED to determine the loss of voltage based on a user-selected threshold.

15. The method of claim 14, wherein the programmable processing device further includes instructions that when processed cause the IED to:

determine an initial average system voltage, and determine a loss of voltage when the voltage of the conductor falls below a value determined by the initial average system voltage and the user-selected threshold.

16. The method of claim 15, wherein the programmable processing device further includes instructions that when processed cause the IED to update the average system voltage during operation of the IED.

17. The method of claim 11, wherein the sensor is configured to monitor an underground medium voltage distribution system.

18. The method of claim 11, wherein the sensor is configured to mount to one of a test Point (TP) and a basic insulating plug (BIP).

19. The method of claim 11, further comprising filtering, using a Low Pass Filter (LPF) in electrical communication with an output of the PGA and an input of the A/D converter, high-frequency components from the signal representative of the voltage of the conductor.

20. The method of claim 11, further comprising, comparing, using the programmable processing device of the IED, the average with a minimum threshold.

* * * * *